United States Patent
Steinlechner

(10) Patent No.: US 6,486,663 B1
(45) Date of Patent: Nov. 26, 2002

(54) METHOD AND CIRCUIT ARRANGEMENT FOR DETERMINING THE DIRECTION OF AN EXTERNAL MAGNETIC FIELD

(75) Inventor: Siegbert Steinlechner, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/857,098

(22) PCT Filed: Sep. 29, 2000

(86) PCT No.: PCT/DE00/03403

§ 371 (c)(1),
(2), (4) Date: May 31, 2001

(87) PCT Pub. No.: WO01/25806

PCT Pub. Date: Apr. 12, 2001

(30) Foreign Application Priority Data

Oct. 2, 1999 (DE) .......................... 199 47 761

(51) Int. Cl.$^7$ ............................ G01R 33/09; G01B 7/30
(52) U.S. Cl. .................. 324/252; 324/207.21; 324/225; 33/355 R
(58) Field of Search ................ 324/277.21, 225, 324/252; 33/355 R

(56) References Cited

U.S. PATENT DOCUMENTS

| 4,240,069 A | 12/1980 | Hollein et al. .............. 341/7 |
| 4,995,165 A | 2/1991 | Daniels ...................... 33/361 |
| 5,351,005 A | 9/1994 | Rouse et al. ............... 394/225 |

FOREIGN PATENT DOCUMENTS

DE 198 39 446 8/1998

*Primary Examiner*—Edward Lefkowitz
*Assistant Examiner*—Reena Aurora
(74) *Attorney, Agent, or Firm*—Michael J. Striker

(57) ABSTRACT

A method for determining the direction of an external magnetic field (B) using a magneto-resistive sensor comprises the following steps: superimposing a fluctuating magnetic field on the external magnetic field (B); creating a first and second signal dependent on the sine and cosine of the angle between the external magnetic field and a reference vector by decoupling or disregarding the respective signal components which are dependent on the fluctuating magnetic field; determination of a third signal which is dependent upon the angle between the external magnetic field and a reference vector on the basis of the first and second signal whereby said third signal has a periodicity of 180°; determination of a logic correction signal (K5) with regard to the signal component which is dependent on the fluctuating magnetic field decoupled from either the first or second signal and which adopts a value for the angle of the external magnetic field in a first angle range, in particular between 0° and 180° and adopts another value in a second angle range, in particular between 180° and 360°; and determination of the actual angle of magnetic field (B) on the basis of a logic correction signal (K5) and the third signal.

6 Claims, 5 Drawing Sheets

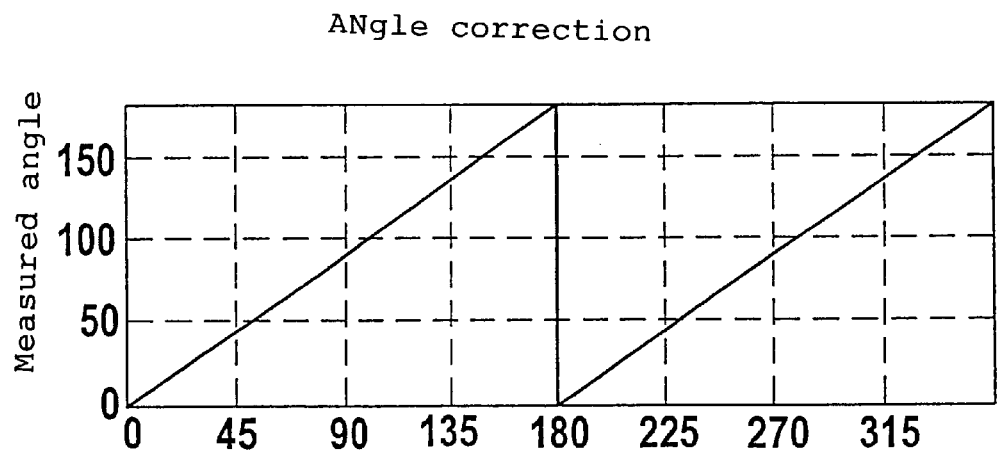
FIG. 6
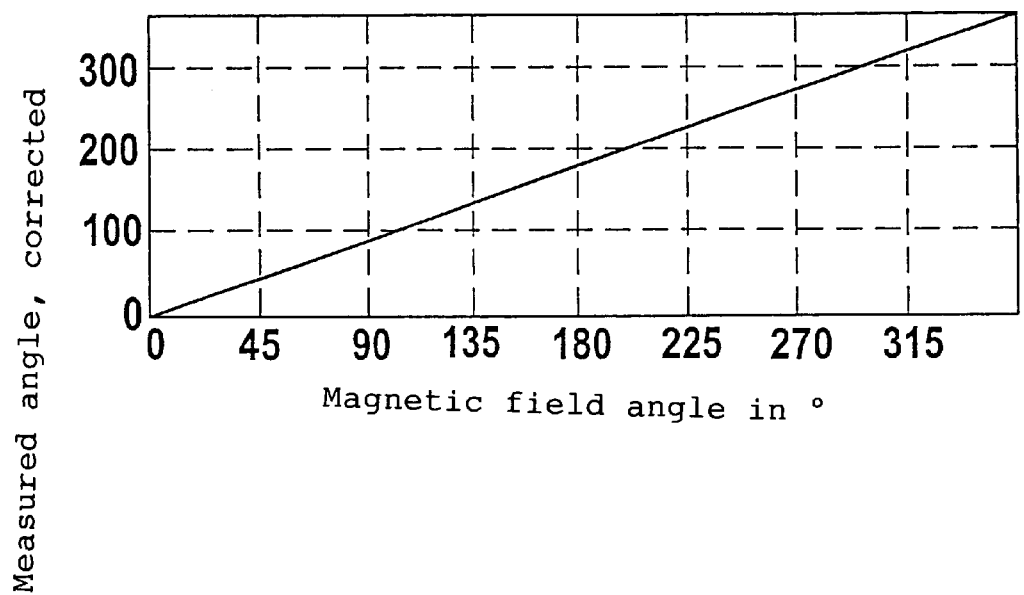

METHOD AND CIRCUIT ARRANGEMENT FOR DETERMINING THE DIRECTION OF AN EXTERNAL MAGNETIC FIELD

BACKGROUND OF THE INVENTION

The present invention relates to a method and a circuit arrangement for determining a direction of an exterior magnetic field.

The use of magnetoresistive elements in the context of angle sensors is known. For instance, on the basis of the AMR (anisotropic magnetoresistance) effect, angle sensors furnish output signals from which the direction of an externally applied magnetic field can be determined. If the angle of the magnetic field relative to the sensor is $\alpha$, then the sensor produces output signals that are proportional to $\sin(2\alpha)$ and $\cos(2x\alpha)$. AMR sensors that function in this way furnish a nonambiguity range of 180° available, based on the periodicity of the sine and cosine signals. In a further development of such AMR sensors, as disclosed for instance in German Patent Application DE 198 39 446, which had not yet been published by the priority date of the present application, these sensors are embodied with integrated auxiliary coils.

By application of a suitable current to the auxiliary coils, individual, slight additional magnetic fields are generated in the various sensor halves; these fields are superimposed on the exterior magnetic field to be measured and change the direction of the resultant field. By observation of the change in direction, the nonambiguity range of the sensor can be increased from 180° to 360°.

SUMMARY OF THE INVENTION

The object of the invention is to assure the simplest possible triggering and evaluation of an angle sensor that has a nonambiguity range of 360°.

This object is attained by a method for determining the direction of an exterior magnetic field B, using a magnetoresistive sensor, having the following steps:

superimposing a fluctuating magnetic field on the exterior magnetic field B;

generating a first and second signal, dependent on the sine and cosine of the angle of the exterior magnetic field relative to a reference direction, eliminating or ignoring any signal components dependent on the fluctuating magnetic field;

ascertaining a third signal, which can be associated with the angle of the exterior magnetic field relative to the reference direction, on the basis of the first and second signal, this third signal having a periodicity of 180°;

ascertaining a correction logic signal, taking into account the signal component, eliminated from the first and second signal and dependent on the fluctuating magnetic field, which signal component assumes a first level for an angle of the exterior magnetic field B in a first angle range, in particular between 0 and 180°, and a second level in a second angle range, in particular between 180 and 360°; and ascertaining the actual angle of the magnetic field B on the basis of the logic correction signal and of the third signal.

According to the invention, an interference-proof triggering and evaluation method for 360° AMR angle sensors, which for instance functions independently of a temperature-dependent amplitude of the sensor signals, is made available. Fixed threshold values are not needed for performing the method. The method can be achieved economically in an electronic circuit. Measuring the effect of the current in the auxiliary coil, by means of which coil the fluctuating magnetic field is generated, is done continuously in the background, without interfering with the measurement of the uncorrected angle (that is, the angle of the magnetic field to be measured). As a result, compared with known versions that use auxiliary coils, the current in the auxiliary coil can be kept quite low, and thus thermal effects in the sensor that conventionally occur can be avoided. Also because of the low coil current, the total power loss is markedly reduced compared with conventional versions.

Advantageous features of the method and of the arrangement according to the invention are the subject of the dependent claims.

In preferred embodiment of the method of the invention, the first and the second signal, which can be assigned to the sine and the cosine, respectively, of the exterior magnetic field are additionally taken into account for ascertaining the logic correction signal K5. The first and second signal are each delivered to comparators, which by comparison of these signals with threshold values generate logic signals. By logical linkage of the logic signals thus obtained with logic signals obtained on the basis of the eliminated signal components, the correction logic signal can be furnished in a way that is computationally uncomplicated.

In a further preferred feature of the method of the invention, for ascertaining the logic correction signal, a further digital signal K6 is used, which assumes a first or second level as a function of an angle that can be associated with the fifth signal. With this provision, two comparators, which must be furnished if two logic signals on the basis of the first and second signals are furnished, can be dispensed with.

Expediently, the further logic signal assumes a first level for an angle range from 135 to 180°, and a second level for an angle range from 0 to 135°.

The object of the invention is also attained by a circuit arrangement having the characteristics of claim 5. This circuit arrangement is relatively inexpensive to furnish and at little effort and expense makes it possible to create a 360° angle sensor, using an AMR sensor, which intrinsically has a nonambiguity range of 180°, and a corresponding logic correction signal.

BRIEF DESCRIPTION OF THE DRAWINGS

Preferred embodiments of the invention will now be described in detail in conjunction with the accompanying drawing. Shown in the drawing are FIG. 1, a first preferred embodiment of the circuit arrangement of the invention;

FIG. 6, a graph showing measured magnetic field angles that can be obtained by the method and the circuit arrangement of the invention, as a function of an actual magnetic field angle.

DESCRIPTION OF THE PREFERRED EMBODIMENTS

Figure 1:
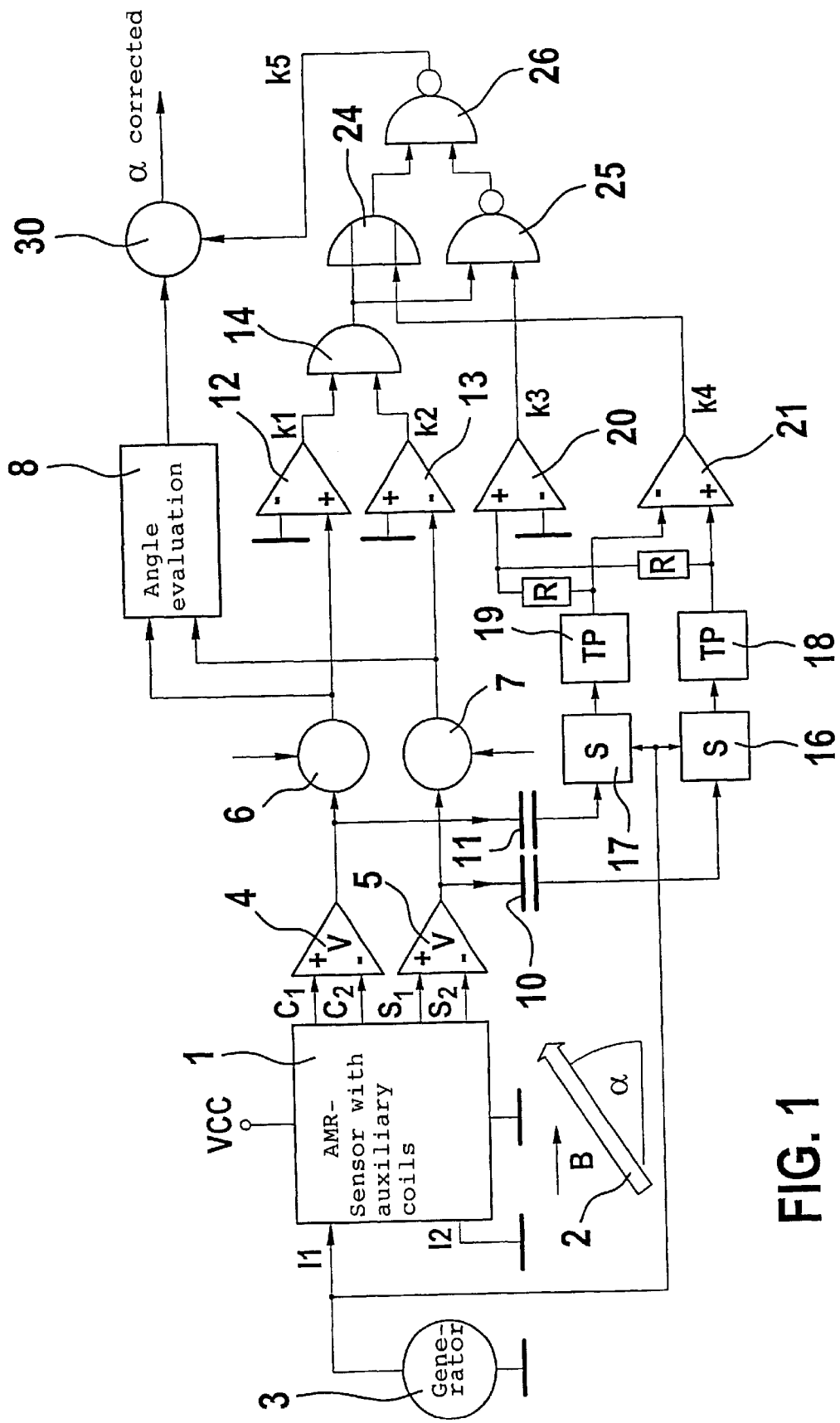

In FIG. 1, an AMR sensor is indicated by reference numeral 1. The AMR sensor 1 is subjected to a supply voltage VCC. The AMR sensor 1 is embodied with auxiliary coils (not shown); by application of an alternating current to these auxiliary coils, fluctuating magnetic fields can be generated, which are superimposed on an external field that is to be measured. The direction of the exterior magnetic field B to be measured is represented by the arrow 2. In the (instantaneous) state shown, the magnetic field B has an angle α relative to a reference direction. It will be noted that the fluctuating magnetic field is small compared to the exterior magnetic field.

The auxiliary coils are supplied via a generator 3 with an alternating voltage whose frequency is typically in the kHz range. In the drawing, only the terminals 11, 12 of the auxiliary coil are shown. The alternating voltage preferably involves a square signal, which is relatively simple to generate.

The measurement task of the AMR sensor is to determine the direction of the magnetic field B, that is, the angle α, unambiguously over a range from 0 to 360°.

The AMR sensor 1, at its outputs $C_1$, $C_2$, furnishes a sine-wave signal that can be associated with the angle α, and at its outputs $S_1$, $S_2$, it furnishes a cosine-wave signal that can be associated with the angle α. These signals are initially amplified in respective differential amplifiers 4 and 5.

Figure 3:
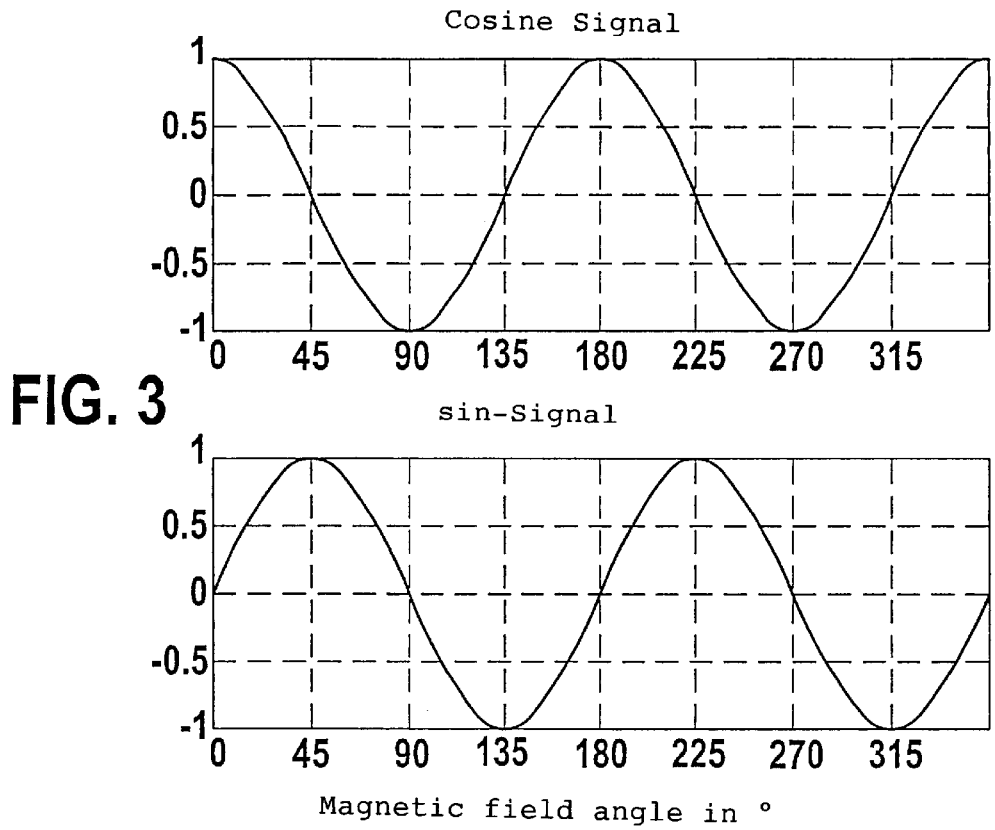
FIG. 3, a graph showing cosine-wave and sine-wave signals obtained as a function of an exterior magnetic field when an AMR sensor is used.

After any offset voltages that may be possible are subtracted in subtractors 6 and 7, signals of the form Acos (2α) and Asin (2α), respectively, are available. Here, A represents the temperature-dependent amplitude of the signal. Such signals are shown for illustration purposes in FIG. 3.

The output signals of the differential amplifiers 4, 5 represent first and second signals. The magnetic total field is composed of the exterior magnetic field to be measured and the magnetic field generated by the auxiliary coils.

The relatively slight fluctuations in these first and second signals that are caused by the fluctuating magnetic field play no role, or can be ignored, for an angle evaluation that is then performed in an angle evaluation unit 8. This is because, first, the incident fluctuations can be averaged out in an angle calculation in the unit 8, and second, that capacitors, described in detail hereinafter, act as high-pass filters with regard to the fluctuating component of the first and second signals, and the fluctuations in the first and second signals can be eliminated by way of these filters.

The angle evaluation unit 8 initially determines the uncorrected angle α, which is unambiguously determined only in the range from 0 to 180°. This can be done for instance by forming the arc tangent, especially by the formula:

$$\alpha = 0.5 * \arctan([A*sin(2*\alpha)]/[A*cos(2*\alpha)]).$$

The first and second signal are also delivered to two comparators 12, 13. Then the logic correction signal K1 of the comparator 12 equals 1, if the third signal (cosine-wave signal) is $\geq 0$. Then the signal K2 (the logic output signal of the comparator 13) equals 1, if the fourth signal (sine-wave signal) is <0. The signals K1, K2 are then delivered to an AND element 14.

Figure 4:
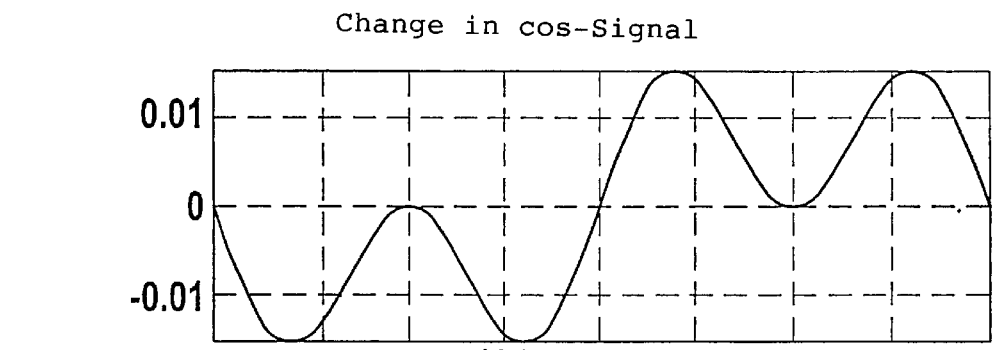
FIG. 4, a graph showing changes in the signals of FIG. 3 in the event modulation of an external field by a fluctuating further magnetic field.

The slight fluctuations in the first and second signal that are caused by the alternating current in the auxiliary coil are eliminated via the aforementioned capacitors 10, 11 and carried to two synchronous demodulators 16, 17, followed by respective low-pass filters 18, 19. At the pace of the generator signal of the generator 3, the synchronous demodulators periodically change the polarization of the respective input signal. The result is a phase-sensitive rectification of the alternating component. At the outputs of the low-pass filters, the signals shown in FIG. 4, "change in cosine signal" and "change in sine signal" can be observed directly.

From these signals, two further comparators 20, 21 form further logic signals K3 and K4. The signal K3=1 when the sum of the sine change signal and the cosine change signal is $\geq 0$; the signal K4=1, if the difference between the sine change signal and the cosine change signal is $\geq 0$.

Figure 5:
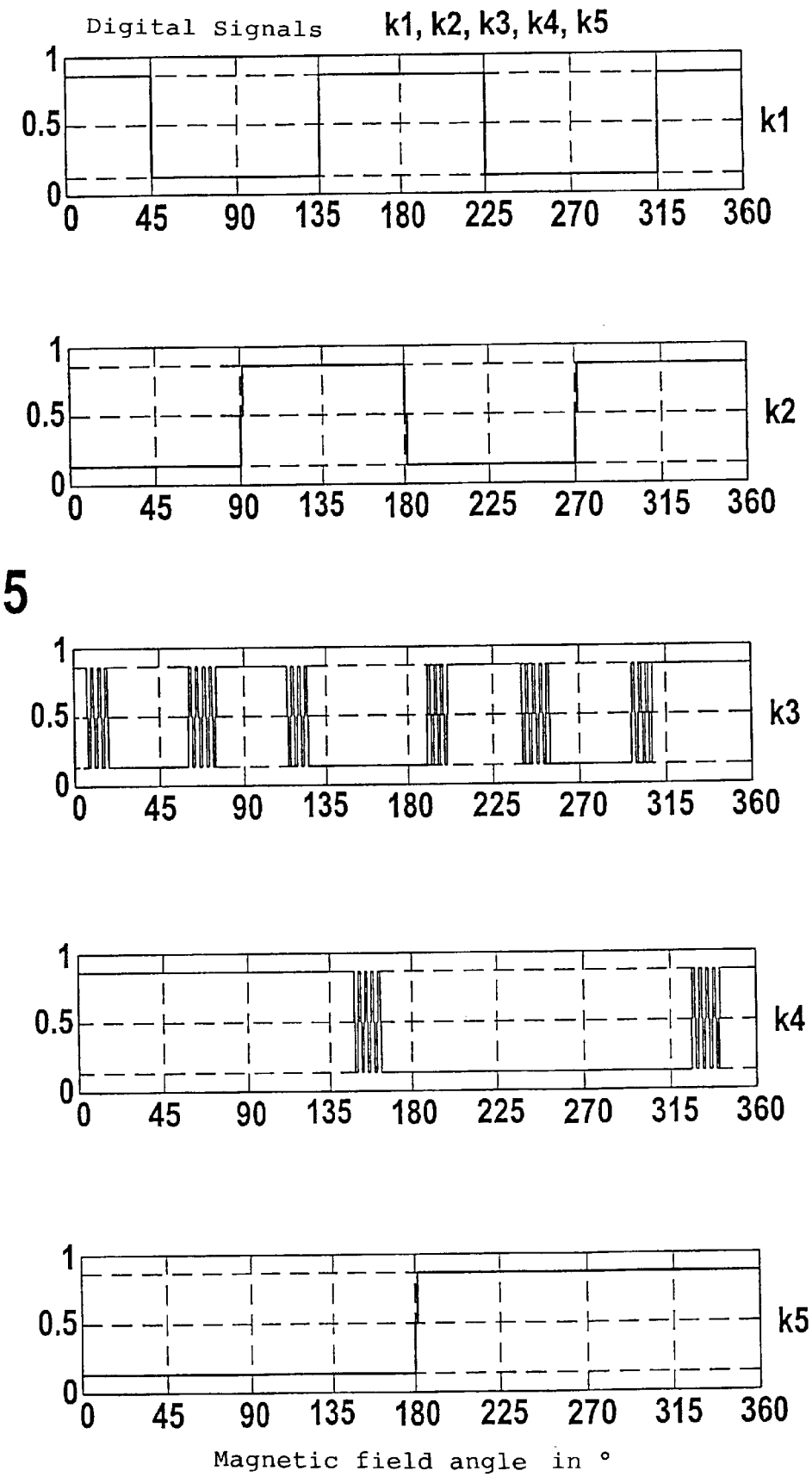
FIG. 5, a graph showing digital signals obtained in the context of the embodiment of the method of the invention shown.

The logic or digital signals K1–K4 are plotted in FIG. 5, in the first four lines, as a function of a respective angle of the exterior magnetic field.

From the logic signals K1–K4, by means of the aforementioned AND element 14, an OR element 24, and two NAND elements 25, 26, a further logic signal K5 is formed in the manner shown by logical combination. The signal K5 should=0 in the range from 0 to 180° and should=1 in the range from 180 to 360°. The signal K5 is shown in FIG. 5, bottom line.

The logic signal K5, together with a fifth signal obtained in the angle evaluation unit 8, is delivered to an evaluation and adder unit 30. In the case where a assumes the value of 1, a correction value of 180° is added in this element 30 to the output signal of the angle evaluation unit 8, so that on the basis of an uncorrected angular value, which has a periodicity of 180°, a corrected angular value with a periodicity of 360° can be furnished. This becomes clear from FIG. 6, in which the uncorrected angle is shown at the top and the corrected measured angle is shown at the bottom, in both cases as a function of an actual angle of the exterior magnetic field.

It will be noted that in FIG. 5 with respect to the logic signals K3, K4, angle ranges have been ascertained that are characterized by a frequent change from 0 to 1. In these ranges, an unambiguous statement about the sign of the corresponding input signal cannot be made, since the input signal in that case is very small, and offset voltages of the comparators or noise signals can under some circumstances then lead to adulterated information.

The logic embodied according to FIG. 1 for calculating the correction value K5 takes account of this fact. The signals K3 and K4 are determined only in the angle ranges for ascertaining K5 in which regions they can each be determined "with certainty".

Figure 2:
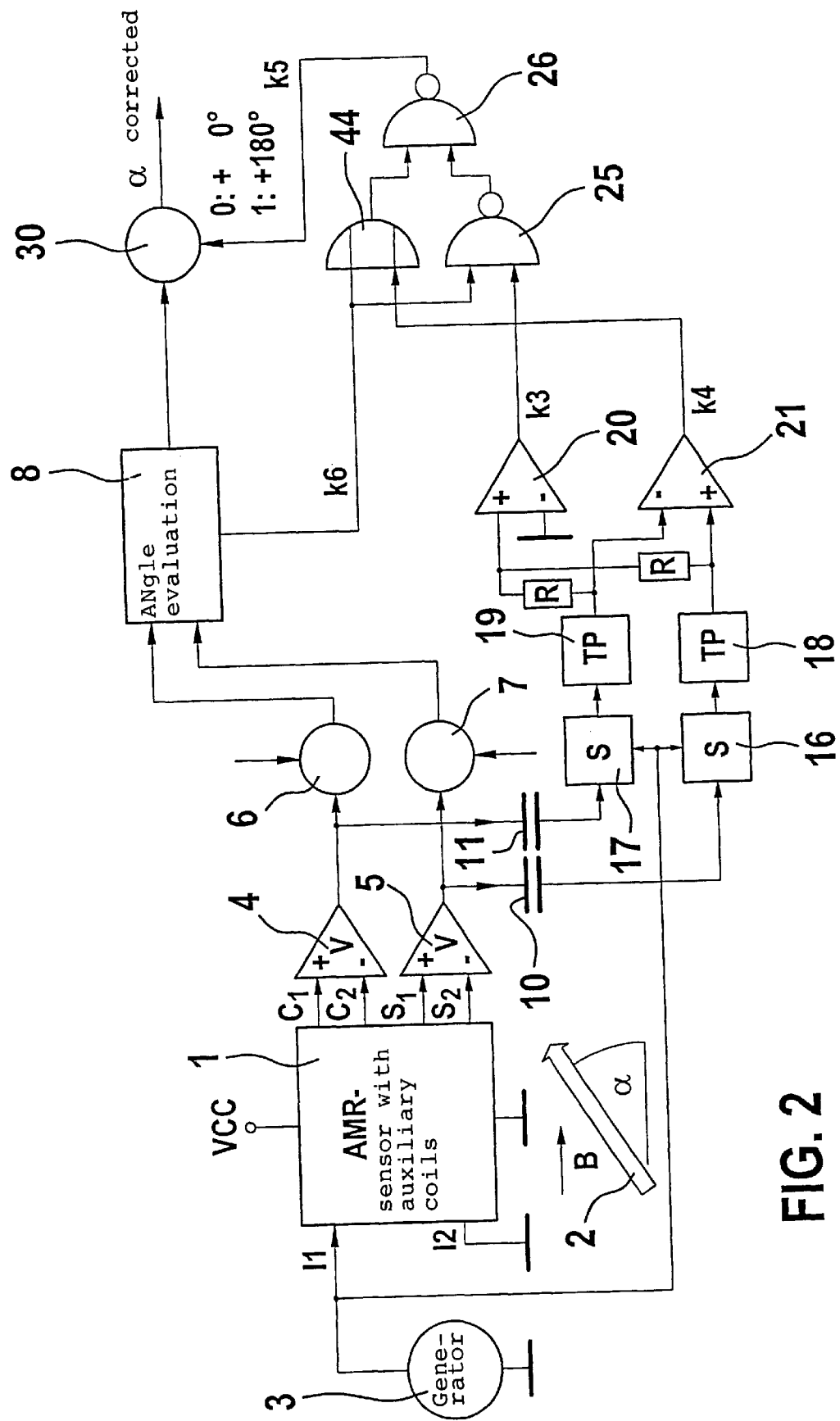
FIG. 2, a second preferred embodiment of the circuit arrangement of the invention.

FIG. 2 shows a modification of the circuit of FIG. 1. Identical or equivalent components are identified by the same reference numerals as in FIG. 1.

The embodiment in FIG. 2 differs from that of FIG. 1 in that a logic signal K6 is fed directly from the angle evaluation unit 8 to an OR element 44. Here, K6=1, if the measured uncorrected angle α is in the range from 135 to <180°. By this provision, in comparison to the circuit of FIG. 1, it is possible to dispense with two comparators and one AND element and nevertheless to make a suitable logic signal K5 available. In this connection it should be pointed out in particular that as a result, the influence of the offset voltages of the two omitted comparators is thus eliminated as well.

What is claimed is:
1. A method for determining the direction of an exterior magnetic field B, using a magnetoresistive sensor, having the following steps:
   superimposing a fluctuating magnetic field on the exterior magnetic field B;

generating a first and second signal, dependent on the sine and cosine of the angle of the exterior magnetic field relative to a reference direction;

eliminating or ignoring any signal component dependent on the fluctuating magnetic field;

ascertaining a third signal, which can be associated with an angle of the exterior magnetic field relative to the reference direction, on the basis of the first and second signal, this third signal having a periodicity of 180°;

ascertaining a correction logic signal K5, taking into account the signal component, eliminated from the first and second signal and dependent on the fluctuating magnetic field, which signal component assumes a first level for an angle of the exterior magnetic field B in a first angle range, in particular between 0 and 180°, and a second level in a second angle range, in particular between 180° and 360°; and ascertaining the actual angle of the magnetic field B on the basis of the logic correction signal K5 and of the third signal.

2. The method of claim 1, characterized in that for ascertaining the logic correction signal K5, the first and the second signal are taken into account in addition.

3. The method of claim 1, characterized in that for ascertaining the logic correction signal, a further digital signal K6 is used, which assumes a first or second level as a function of an angle that can be associated with a fifth signal.

4. The method of claim 3, characterized in that the further logic signal K6 assumes a first level for an angle range from 135 to 180°, and a second level for an angle range from 0 to 135°.

5. A circuit arrangement for determining the direction of an exterior magnetic field B, using a magnetoresistive sensor, having the means (3) for superimposing a fluctuating magnetic field on the exterior magnetic field B;

means (1, 4, 5) for generating a first and second signal, dependent on the sine and cosine of an angle of the exterior magnetic field relative to a reference direction;

eliminating or ignoring any signal components dependent on the fluctuating magnetic field;

means (8) for ascertaining a third signal, which can be associated with the angle of the exterior magnetic field relative to the reference direction, on the basis of the first and second signal, this third signal having a periodicity of 180°;

means (10, 11, 16, 17, 18, 19, 20, 21, 12, 13, 14, 24, 25, 26) for ascertaining a correction logical signal K5, taking into account the signal component, eliminated from the first and second signal and dependent on the fluctuating magnetic field, which signal component assumes a first level for an angle of the exterior magnetic field B in a first angle range, in particular between 0 and 180°, and a second level in a second angle range, in particular between 180 and 360°; and means (30) for ascertaining the actual angle of the magnetic field B on the basis of the logic correction signal K5 and of the third signal.

6. The circuit arrangement of claim 5, characterized by means (8) for generating a further logic signal K6, which assumes a first or a second level as a function of an angle that can be associated with the third signal.

* * * * *